(12) United States Patent
Nishimura

(10) Patent No.: US 9,436,982 B1
(45) Date of Patent: Sep. 6, 2016

(54) SCALABLE RANK FILTER

(71) Applicant: Intel Corporation, Santa Clara, CA (US)

(72) Inventor: Jun Nishimura, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/750,758

(22) Filed: Jun. 25, 2015

(51) Int. Cl.
*G06K 9/40* (2006.01)
*G06T 5/10* (2006.01)

(52) U.S. Cl.
CPC ....... *G06T 5/10* (2013.01); *G06T 2207/20024* (2013.01); *G06T 2207/20182* (2013.01)

(58) Field of Classification Search
USPC ................. 382/260, 262, 272; 348/E11.021; 375/240.17; 358/1.16, 1.17; 708/270, 708/404, 409
See application file for complete search history.

(56) References Cited

U.S. PATENT DOCUMENTS

| | | | | |
|---|---|---|---|---|
| 6,115,134 A * | 9/2000 | Creel | ...................... | G06K 15/02 358/1.16 |
| 6,198,772 B1 * | 3/2001 | Boice | ...................... | H04N 19/61 348/E11.021 |
| 6,421,696 B1 * | 7/2002 | Horton | .................. | G06F 17/142 708/404 |

FOREIGN PATENT DOCUMENTS

DE          4209172 A1 *  9/1993  ............. H03H 11/02

* cited by examiner

*Primary Examiner* — Anh Do
(74) *Attorney, Agent, or Firm* — Blakely, Sokoloff, Taylor & Zafman LLP

(57) ABSTRACT

A scalable rank filter and method for performing rank filtering are disclosed. In one embodiment, the rank filter comprises a W staged pipeline with W stages to receive N input data samples and operable to generate an output based on the N input data samples as a result of the W stages completing execution, where W is a bit length of the inputs and W and N are integers greater than two; and output logic coupled to the W staged pipeline to determine the output prior to all W stages completing execution and to output the median.

25 Claims, 19 Drawing Sheets

One (W-1) Stage Of The Rank Filter
W: Input Bit Length

SCALABLE RANK FILTER

FIELD OF THE INVENTION

Embodiments relate to the field of rank filters; more particularly, embodiments relate to multi-stage, bit-pipeline rank filters that are capable of outputting a median without executing all stages.

BACKGROUND OF THE INVENTION

A rank filter is a non-linear filter used in signal processing, such as image processing for noise removal, image enhancement and morphological operations. The use of rank filters such as a median filter is important for removing impulsive and Non-Gaussian noise from an image. However, it often costs high computations and hardware area. When the filter kernel size is increased, the complexity increases dramatically, and these are not practical for the Internet of Things (IoT)/Wearable products.

Rank filters are usually categorized based on the algorithm they employ as either word-level algorithms or bit-level algorithms. The word-level algorithms require the use of complex sorting algorithms such as bubble sort, selection sort, merge sort, quick sort, odd-even transposition sort to derive the element in the specified rank. The bit-level algorithms are much more suitable for hardware, and are simpler to derive combinational functions on binary variables.

Many implementations of bit-level rank filtering are implemented in hardware. These implementations include bit-pipeline rank filters that receive input data samples with a certain number of bits each and produce a single bit of output in each pipeline stage. These single bits are accumulated in order to produce an output result each clock cycle independent of the number of input data samples. The conventional pipelined methods do not provide scalability in that the number of stages in the pipeline is fixed and cannot be changed dynamically. Thus, previous rank filter implementations are fixed in their hardware architecture and not scalable for different hardware area or power budget.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A scalable bit-pipelined architecture for rank filter and method for using the same are disclosed. The architecture is useful for bit-level algorithms and allows users to scale the architecture to different hardware area budget. By scaling the architecture, the rank filter is able to consume a smaller amount of power.

Furthermore, in one embodiment, the bit-pipelined architecture is able to produce a median at times with less than the full input bit precision. For example, if the dynamic range is high for certain input data samples, a less number of bit precision is needed to determine the rank filter output. If all the input data samples are close to each other, larger bit precision (up to full input bit precision) are needed to produce the result of the rank filter.

In the following description, numerous details are set forth to provide a more thorough explanation of the embodiments described herein. It will be apparent, however, to one skilled in the art, that the techniques described herein may be practiced without these specific details. In other instances, well-known structures and devices are shown in block diagram form, rather than in detail, in order to avoid obscuring the techniques described herein.

Figure 1:
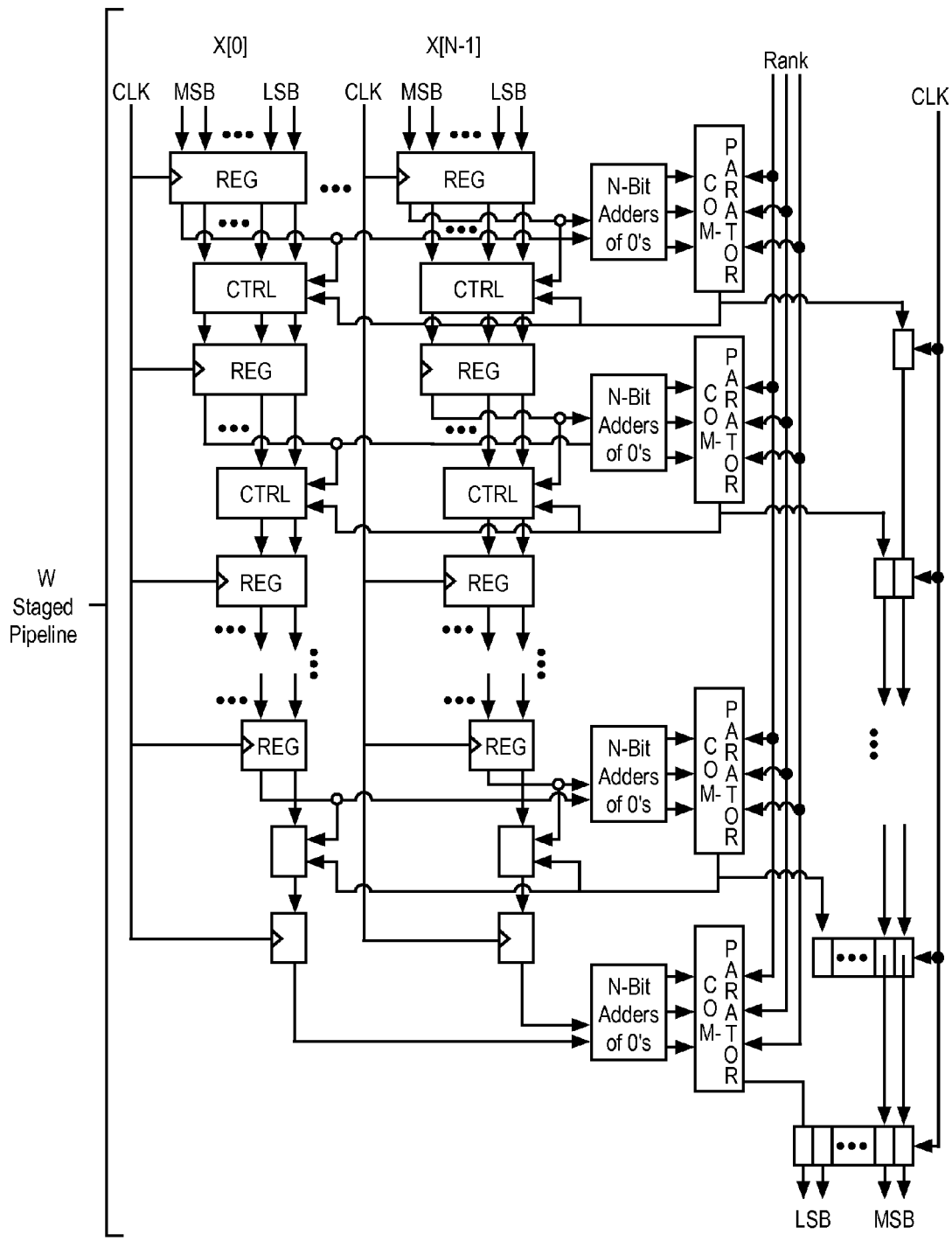
FIG. 1 illustrates one embodiment of a state-of-art bit-level rank filter.

FIG. 1 illustrates the state-of-art bit-level rank filter. Referring to FIG. 1, when the input data samples' bit precision is W, W stages are required in the pipeline to generate the median. N is the number of input data samples (e.g., for 3×3 median, N=9).

During its operation, the MSBs of all N input data samples X[j] are examined first. The N-bit adder of zeroes counts the number of bits with zero value in each input data sample. A comparator compares the sum generated by the N-bit adder of zeros to the desired rank. If the number of zeros counted by the N-bit adder of zeros is greater than the rank, the output of the comparator is zero. This is the result bit output from the comparator. The rank filter passes this results bit through W delaying deskew registers to become the MSB of the output result, which is equal to the rank sample (the selected input data sample which has the specified rank).

If the MSB was zero and the result bit is zero, the rank filter keeps all other bits in an input data sample unchanged. The rank filter also keeps all other bits in an input data sample unchanged in the case the MSB is one and the result bit is one. The rank filter resets all other bits in an input data sample if the MSB is zero and the result bit is one and sets all other bits in an input data sample if the MSB is one and the result bit is zero.

The purpose of these rank filter operations is to pass through input data samples with an MSB equal to the MSB of the rank sample and modify the others in order not to affect further processing. In the next pipelined stage, the rank filter examines the (MSB−1) bit next in the same manner as the MSB, thereby producing the (MSB−1) bit of the rank sample. In the pipelined stage before the last one, the rank filter examines the (LSB+1) bit in the same manner as the MSB, thereby producing the (LSB+1) bit of the rank sample. Finally, in the last pipelined stage, the rank filter examines the LSB bit in the same manner as the MSB, thereby producing the LSB bit of the rank sample.

Figure 2:
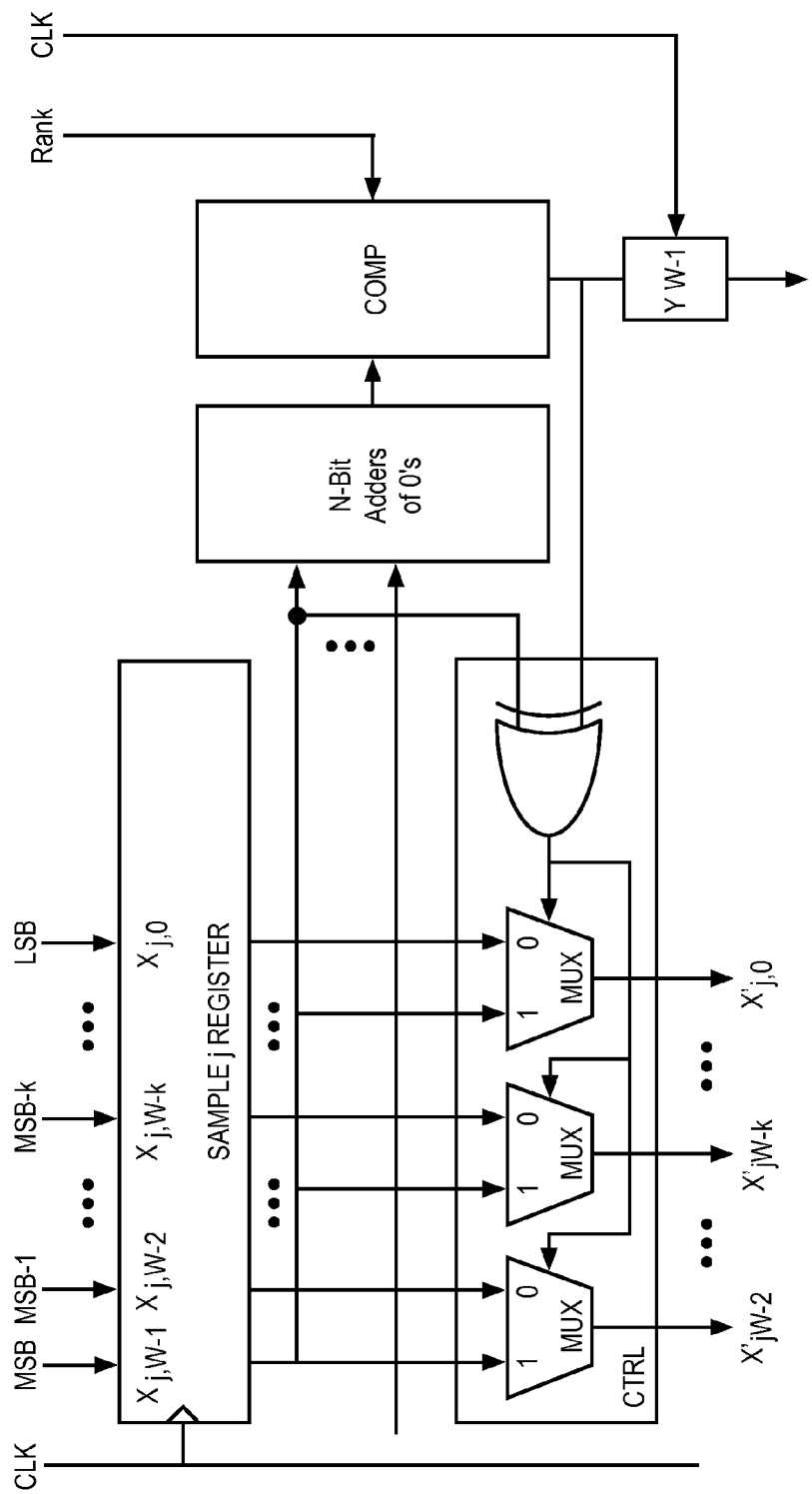
FIG. 2 illustrates one (W−1) stage of the rank filter of FIG. 1.

FIG. 2 illustrates one (W−1) stage of the rank filter of FIG. 1. Referring to FIG. 2, the stage includes a control block (CTRL) 201. Each control block 201 passes through or modifies the input data sample bits as described above. Each control block 201 includes an exclusive-OR (XOR) gate (circuit) and a set of multiplexors to feed a sample register (REG) in the next stage. The selection of one of the multiplexer inputs is provided by an XOR gate output, whose inputs are $x_{j,i}$, which is the MSB of the previous sample register (REG), and y, which is the appropriate output result bit. In case these two bits are identical, the multiplexer output $x_{j,i-1}$ is $x_{j,i-1}$. Otherwise, the (MSB−1) bit of the next sample register (REG) will become $x_{j,i}$, which is the MSB of the previous sample register (REG). Note that only one XOR circuit is sufficient for the selection of all multiplexers in spite of the number of bits, which will be processed in control block 201.

The rank filter includes deskew (shift) registers to delaying the register at the output of each comparator in order to have all the output result bits appear simultaneously in the Y register.

Figure 3A:
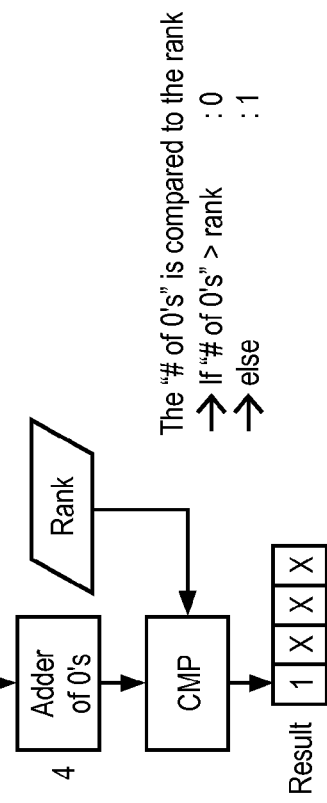
FIGS. 3A-3E illustrate an example of the operation of the rank filter in FIG. 1 where the input data sample length, W, is 4, the rank is 4 and the number of input data samples is 9.
Figure 3B:
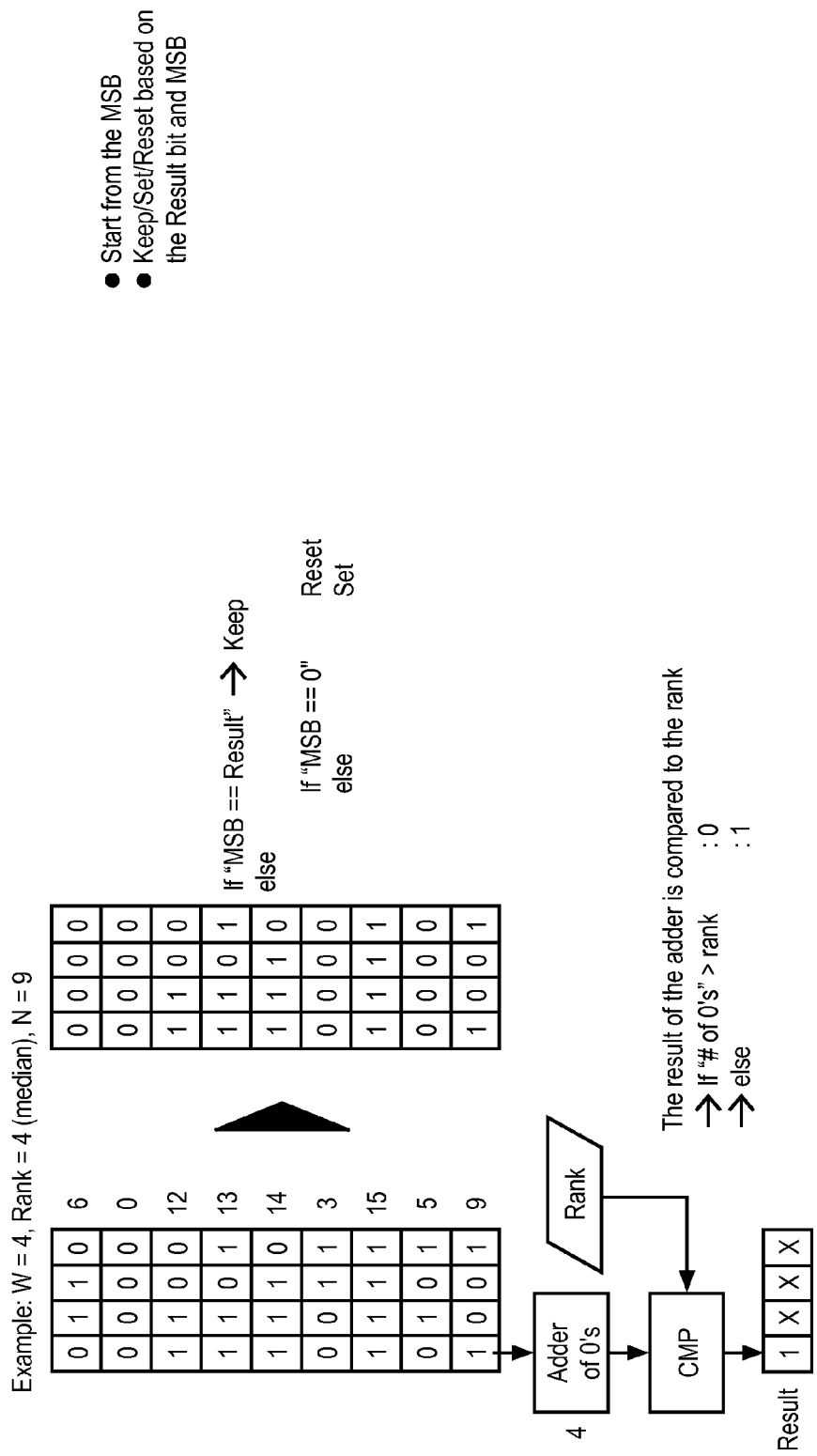
Figure 3C:
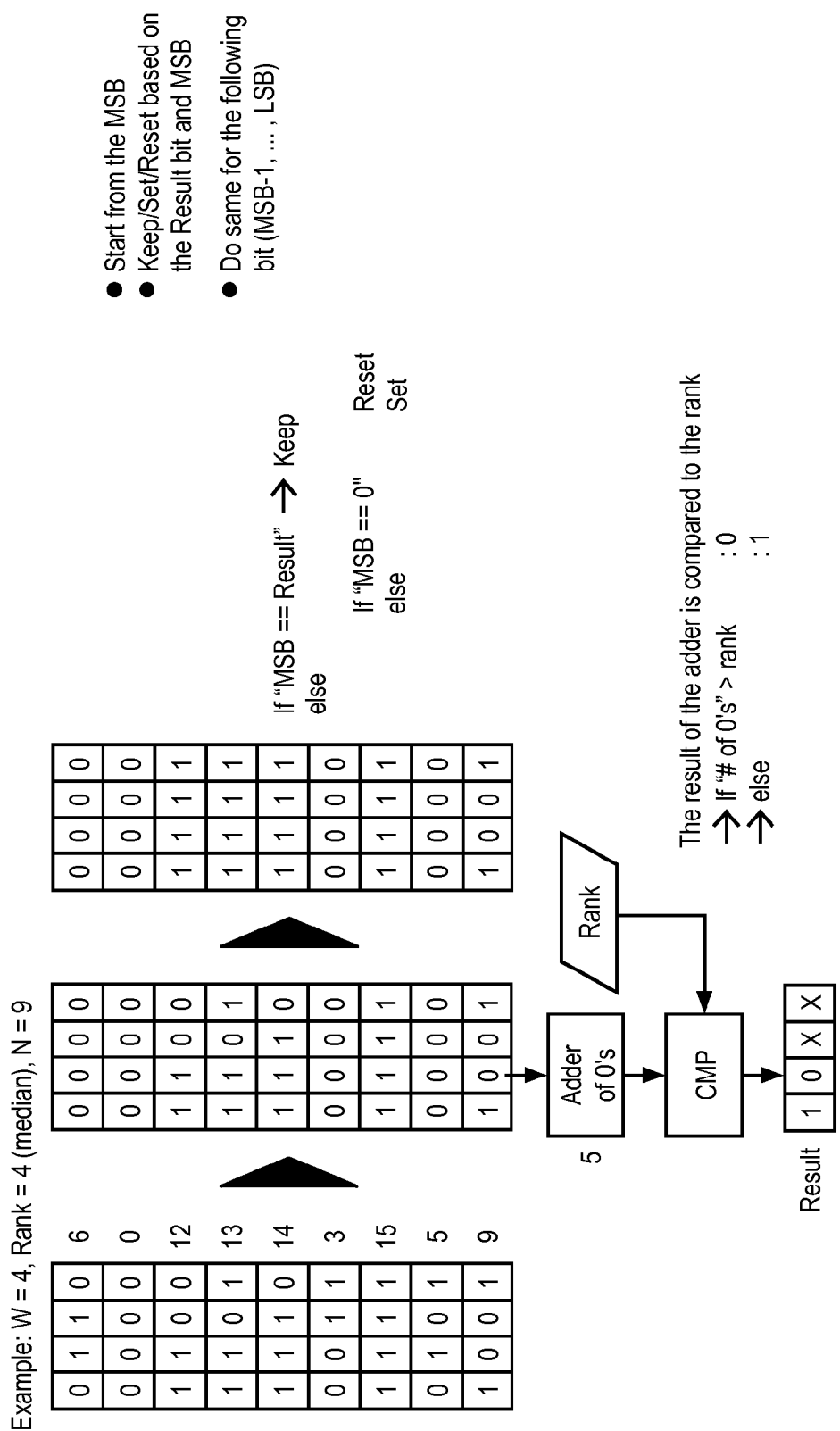
Figure 3D:
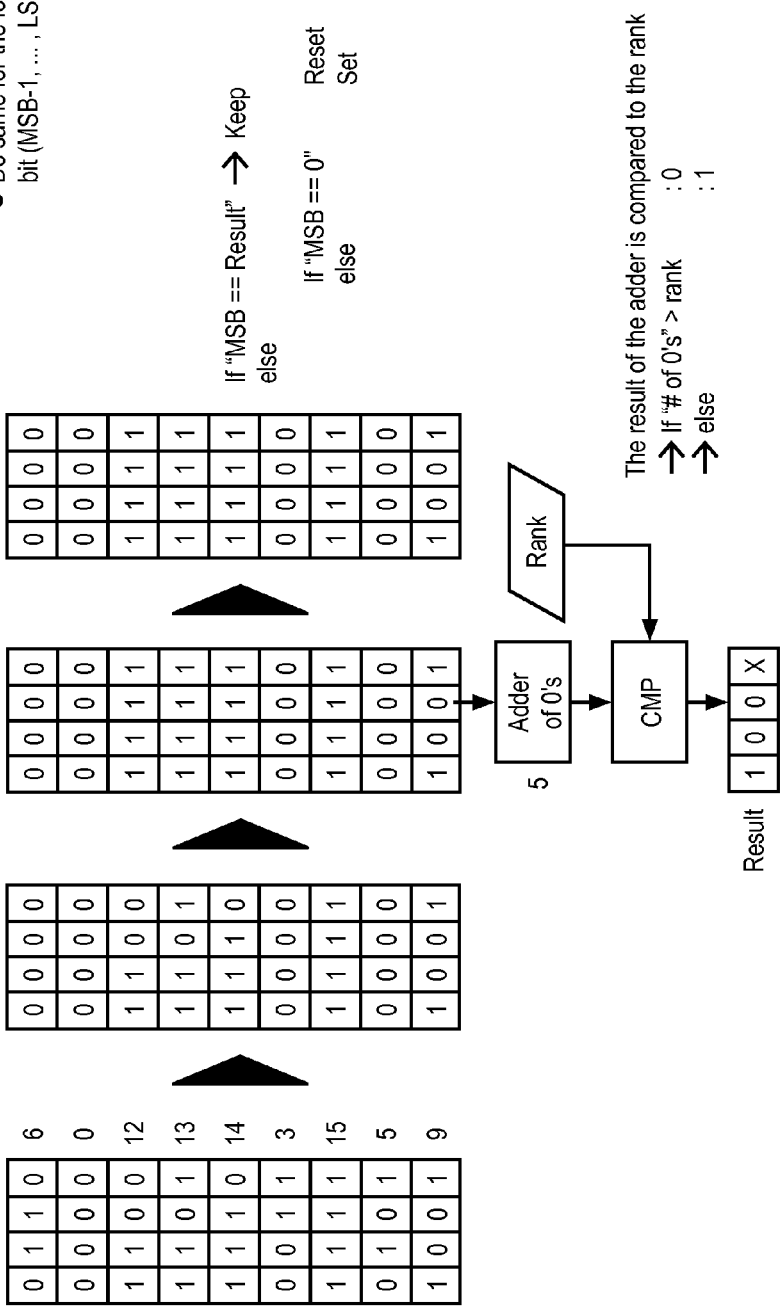
Figure 3E:
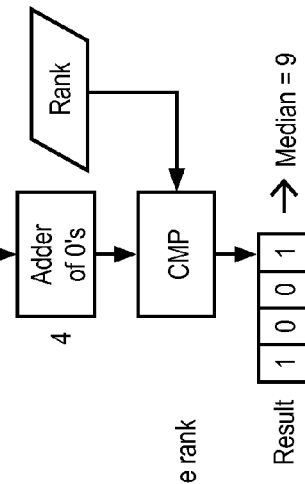

FIGS. 3A-3E illustrate an example of the operation of the rank filter in FIG. 1 where the input data sample length, W, is 4, the rank is 4 and the number of input data samples is 9. Referring to FIG. 3A, starting from the MSB, the N-bit adder counts the number of zeroes and compares the sum to the rank. In this case, the number of zeroes is four, which is not greater than the rank. Therefore, the result bit is set to one. Whether the values in the individual input data samples rows are kept, set or reset is based on the result and the MSB. Referring to FIG. 3B, because the result bit is 1, all of the rows that have an MSB equal to the result bit are kept the same. Otherwise, if the MSB equals zero, all the values in the row are reset to zero and if the MSB equals one, all the values are set to 1. Referring to FIG. 3C, the same process is repeated for the MSB−1 bit position. Specifically, the number of zeroes in the MSB−1 bit position is added and the sum is compared to the rank. In this case, there are five zeros, which is greater than the rank. As a result, since the number of zeroes is greater than the rank, the result bit is set to zero. Therefore, for each of the input data samples, if the MSB−1 bit is equal to the result bit (0), the rest of the values in the input data sample are kept (remain unchanged). For those data samples in which the MSB−1 bit does not equal the result bit (0), then the rest of their bits are reset to zero if the MSB equals zero and are set to one otherwise. Referring to FIG. 3D, the same process is repeated for the MSB−2 bit position, thereby producing a zero result bit. In this case, no other changes are made to bits in the data samples. Referring to FIG. 3E, an adder adds up the number of zeroes in the LSB, which is four and that is compared to the rank. Because the number of zeroes is less than the rank, the result bit is set to one. As a result of running the bit pipeline rank filter, a result is 1001, which means that the median is equal to nine.

As described above, the number of stages required to run is equal to the input bit precision in order to determine the median. That is, the output of the rank filter cannot be extracted until the data bits of all the data samples goes through all the stages of the pipeline. However to limit the hardware area as much as possible (to keep costs of an integrated circuit lower) and to reduce power, it is desirable to extract the output as early as possible. One can naively cut the M (<W) number of stages in the pipeline, but it will end up losing M bit precisions and its output will not match with any of the input data samples due to truncation of the data.

A scalable rank filter is disclosed herein that modifies the architecture set forth in FIG. 1 by introducing a new flag bit to store the inverse of the XOR, providing accurate labeling of the input data samples relevant to the rank filter output, and by including one additional N-bit adder for counting 1 bits to enable the early stopping of the rank filtering calculation.

More specifically, in the state-of-art algorithm in FIG. 2, the XOR output in the control block is used to decide whether to keep certain input data sample data or not. By observing the intermediate data and the rank filter outputs, the inverse of the XOR output can be used as a flag: if 0, input data sample data is still kept; else, input data sample data is set/reset. By taking the sum of 1's of the flag $F_j$ and if the sum $D_{w-1}$ is equal to 1, then the ranking is already fixed. If the ranking is already fixed in the middle of the pipeline, this means the output can be extracted, enabling the early stopping of the rank filtering calculation. This allows the architecture to determine the necessary number of stages dynamically. When the number of the stages in the pipeline is limited to fewer than the input bit precision, this flag can be used to determine which input data samples are kept untouched. In contrast, with the conventional methods, if the final output of the truncated pipeline were taken, the bit precision would be lost and result in the higher error. However, with this flag data introduced, the relevant input data sample can be obtained without losing the bit precision even if the pipeline is truncated.

Figure 4:
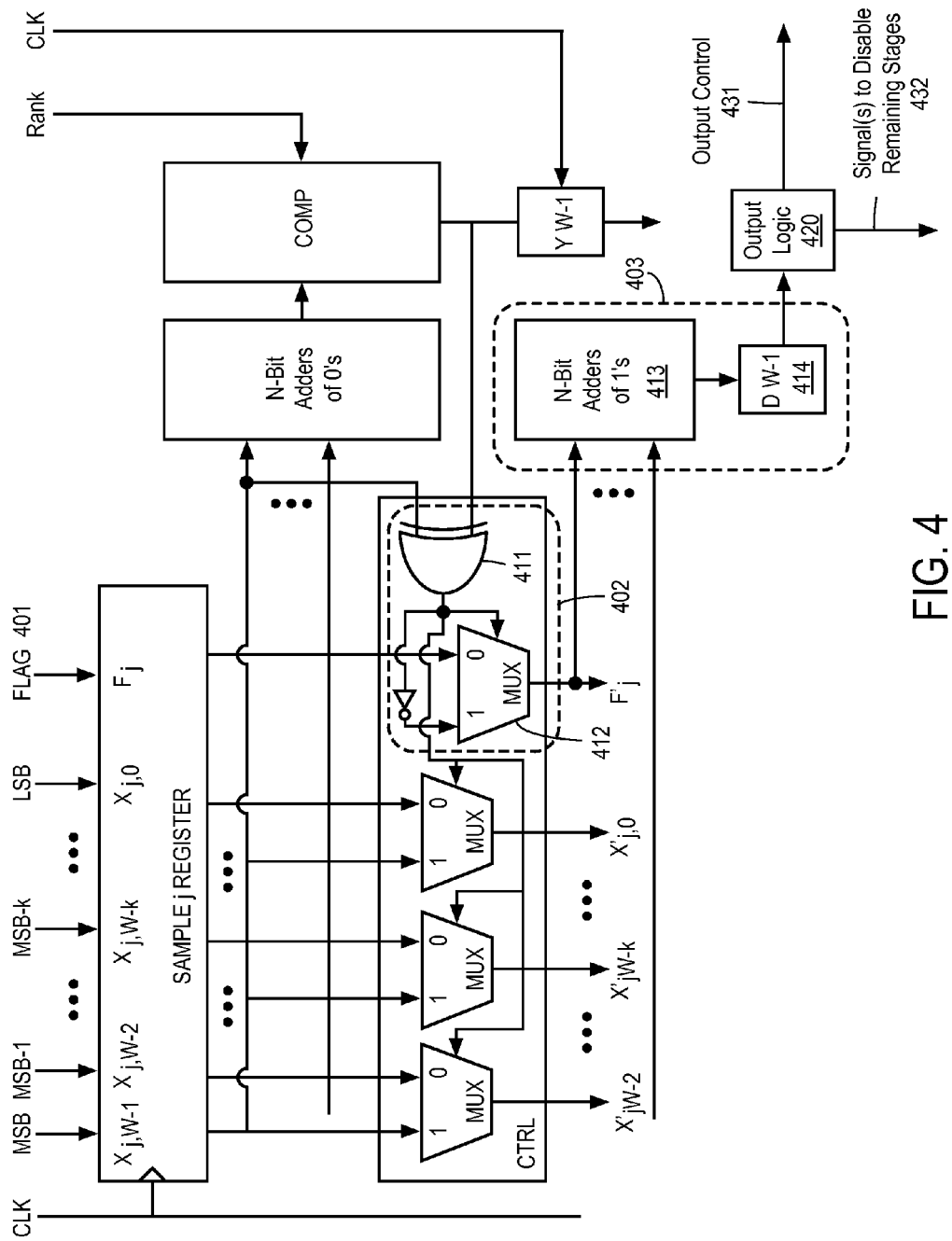
FIG. 4 illustrates one embodiment of a one stage of the bit pipeline rank filter.

FIG. 4 illustrates one stage of the bit pipeline rank filter. This stage replaces the stage of FIG. 2 in the rank filter of FIG. 1. This stage is the same as the stage of FIG. 2 with the exception of the inclusion of flag 401, control block 402 and adder computation 403, as well as output logic block 420.

Referring to FIG. 4, a flag 401 is associated with each of the input numbers. While the rank filter proceeds through its comparison of the number of zeroes to the rank for each bit position, flag bit 401 is tracked. Based on whether there is only one flag bit that remains, the bit pipeline ranked filter is able to determine (flag) when to break out of the pipeline line prior to completing the comparisons of all stages of the filter. Therefore, using flag bit 401 may allow limiting the maximum number of stages that are performed.

Control block 402 includes XOR gate 411 and multiplexor 412. XOR gate generates a control signal to select either the flag bit or the output of the XOR gate 411 as the output of MUX 412. The output of MUX 412 is input into n-bit adder 413, which receives the flag bit output from all the input bit samples. In response to receiving the input, n-bit adder 413 adds the number of ones and outputs it at output register 414. Output logic 420 includes a comparator used to compare the value of output register 414 to one. When the output at output register 414 equals one (indicating that the flag bit of only one of the input data samples remains set), output logic 420 determines that the result is available and processing can break out of pipeline. In another embodiment, output logic 420 includes a comparator for comparing the value of output register 414 to a number other than one (e.g., two). In such a case, when the output at output register 414 equals that number, output logic 420 determines that its result is available and the processing can break out of the pipeline. For example, in one embodiment, output logic 420 stops the pipeline when the sum of ones is two (i.e., greater than one), such as in the case when there are two candidates remaining for the median and processing in the pipeline is stopped. At this point, output logic 420 selects either of the two candidates to output. The selection may be selecting from the top candidate or the bottom candidate where the input data samples are in a column. Alternatively, the selection could be the left candidate or right candidate when the input data samples are in a row.

In one embodiment, to break out of the pipeline, output logic 420 prevents one or more stages of the pipeline that have not yet completed from completing. In one embodiment, output logic 420 prevents the one or more stages from completing by disabling them. In one embodiment, output logic 420 disables the one or more stages by signaling them with signal(s) 432.

In one embodiment, output logic 420 also generates output control 431 (e.g., one or more signals) to cause the output of the rank filter to be selected and output. Such signaling may be used to cause one of the input data samples (or a register containing the same) to be output as the output of the rank filters when output logic 420 determines the output is available before all the stages have completed execution. Also such signaling may be used to select one of 2 (or more) input data samples that remain after stopping the pipeline when the sum of ones is greater than one (e.g., two).

Note that if the input data samples are signed inputs, then the MSB of the input data samples are inverted prior to the pipeline of FIG. 1.

Figure 5A:
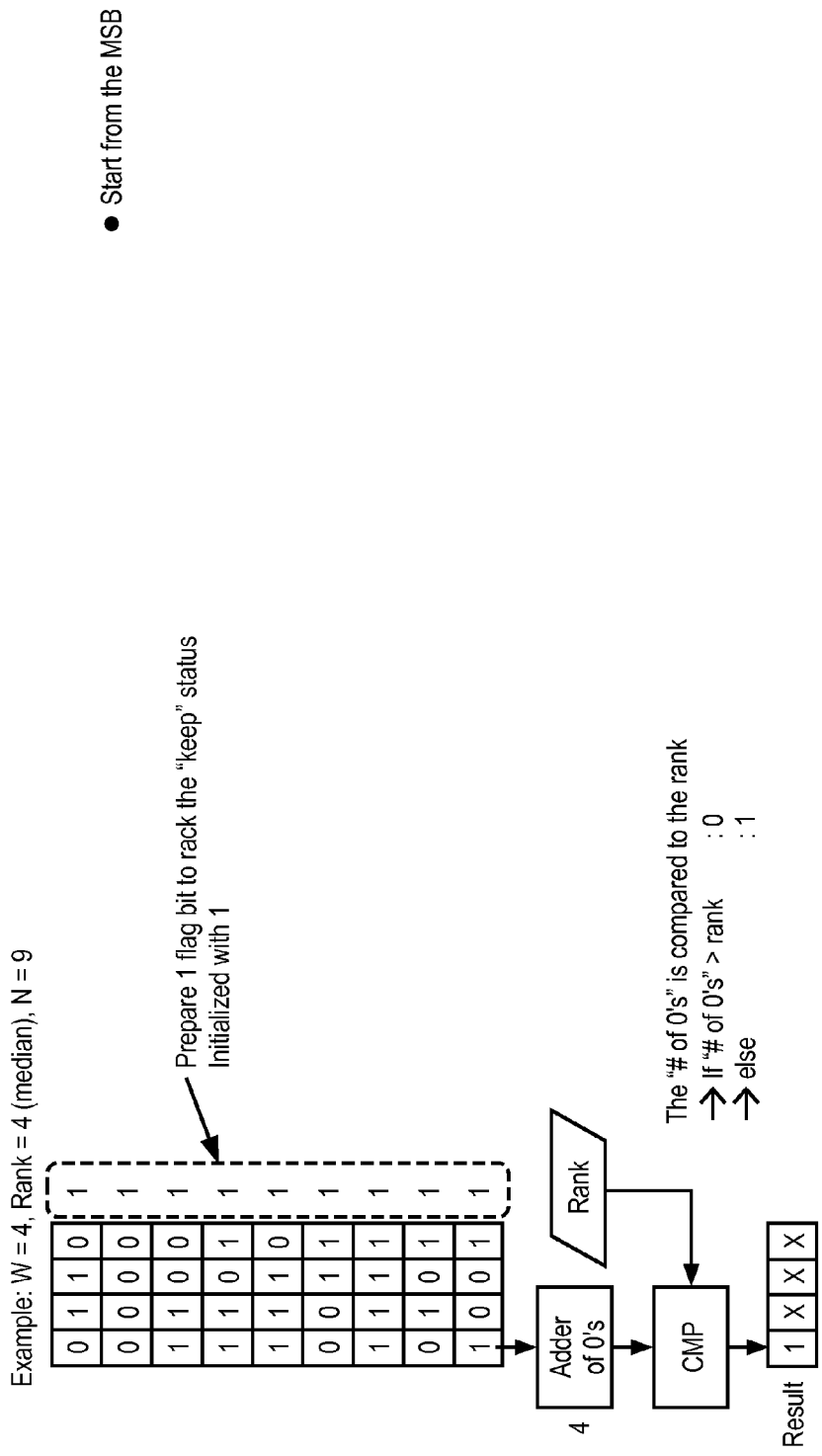
FIG. 5A-E illustrate the same example described above with respect to FIGS. 3A-E only including the use of the flag bit to the keep track of the status of the rank filter processing.
Figure 5B:
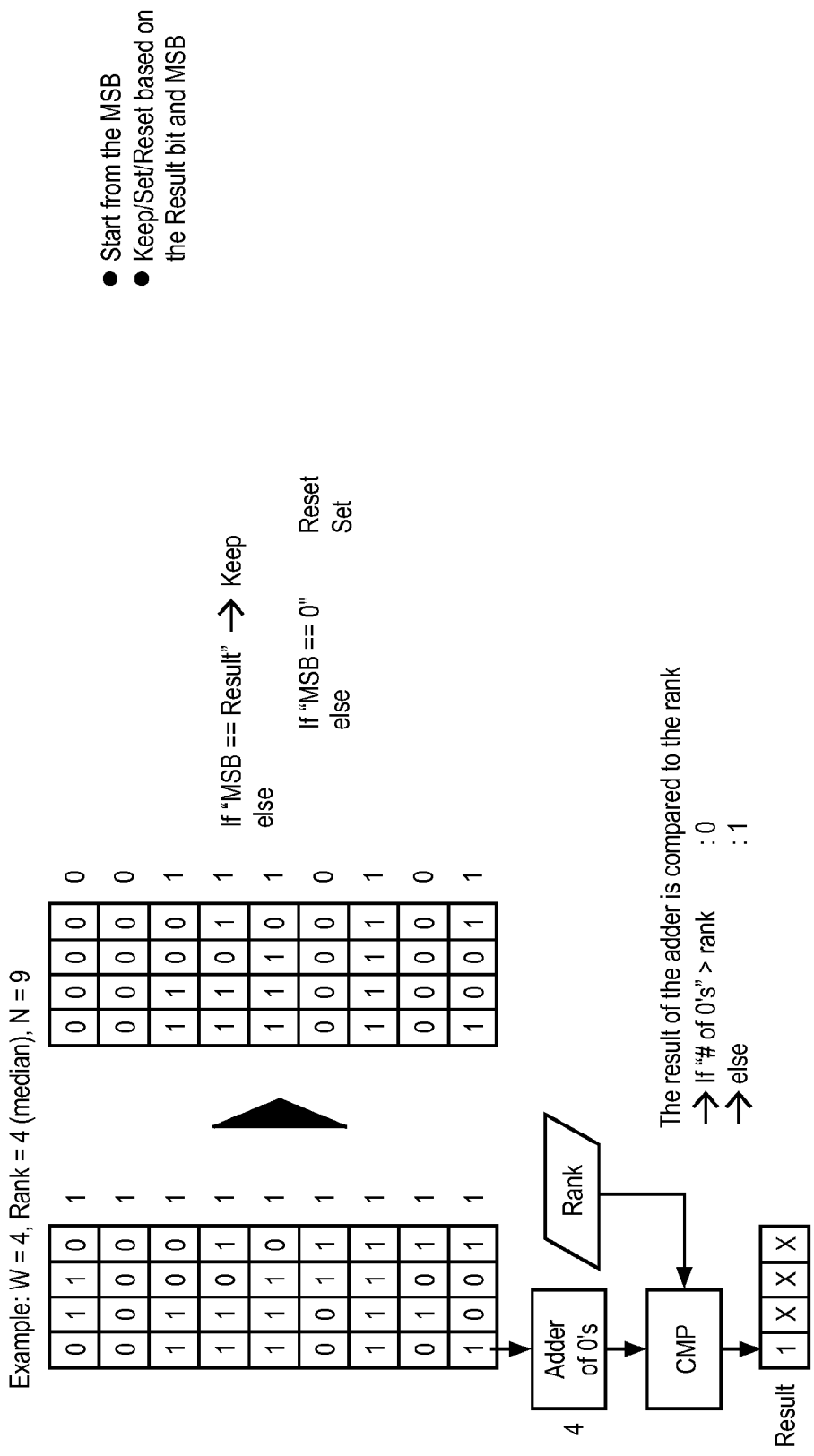
Figure 5C:
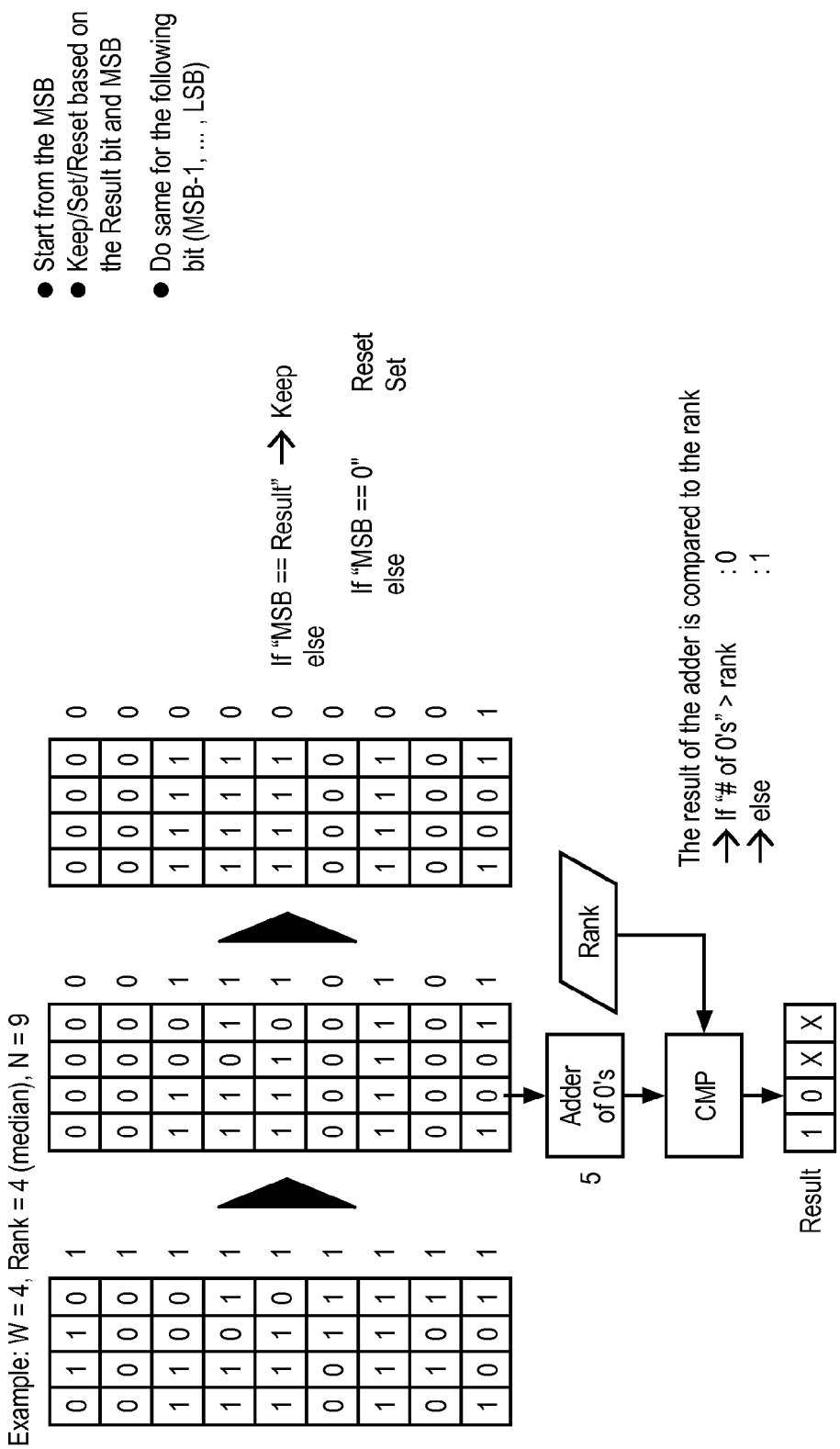
Figure 5D:
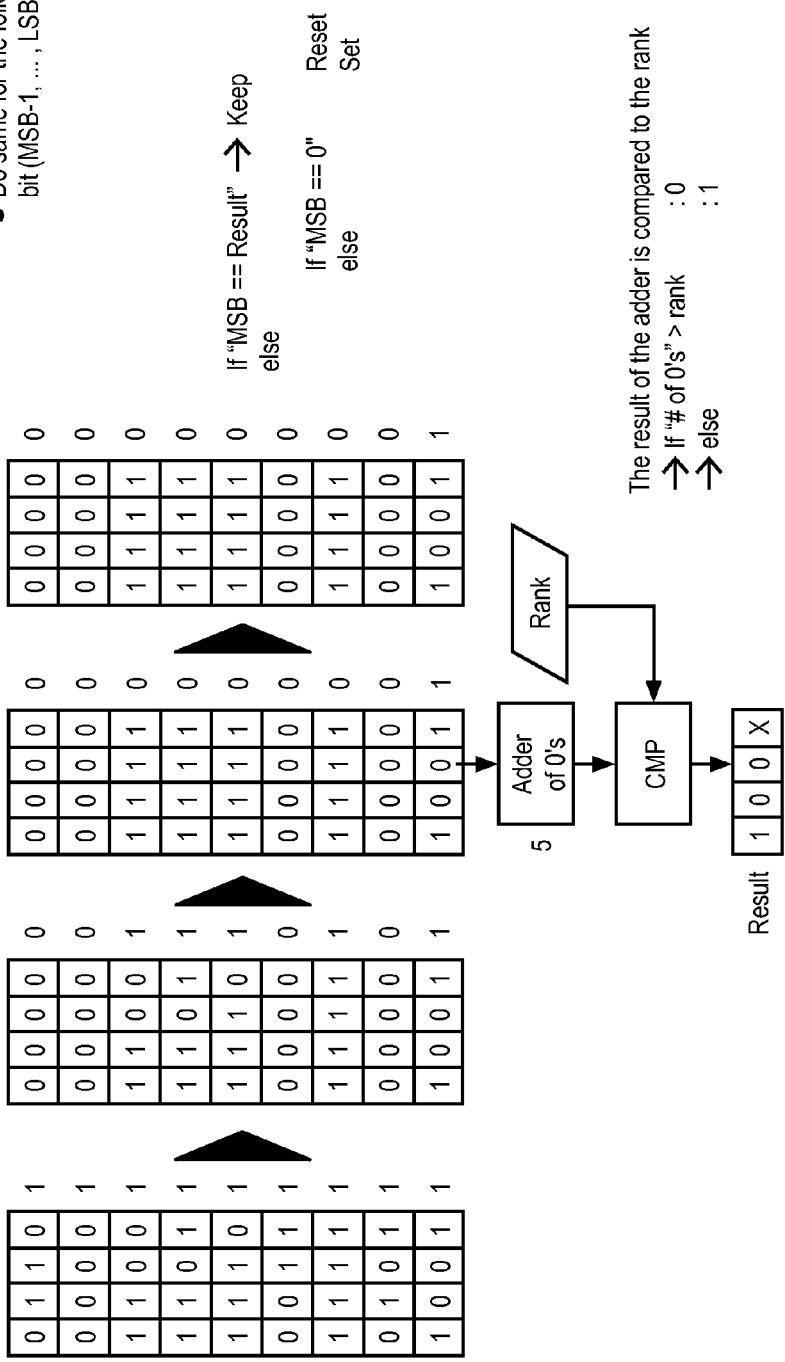
Figure 5E:
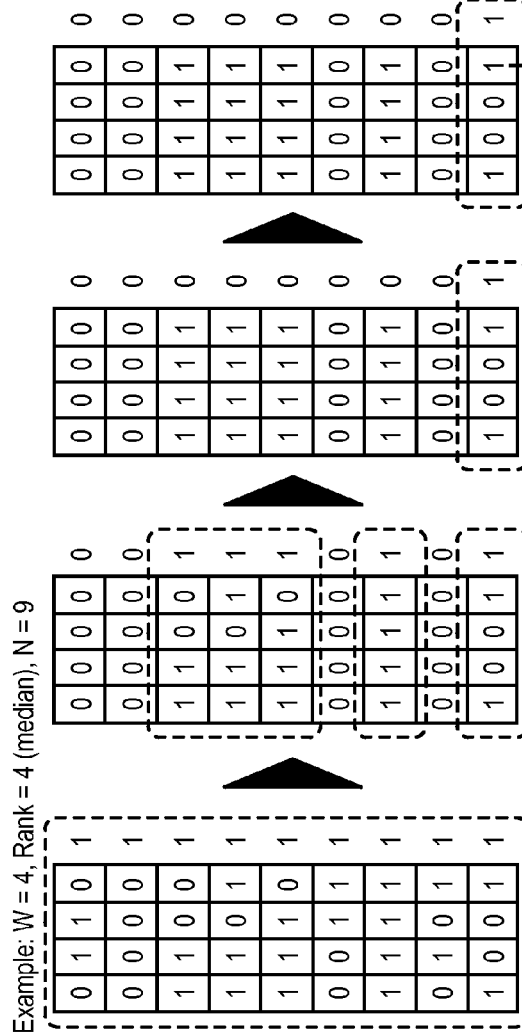
Figure 5E:
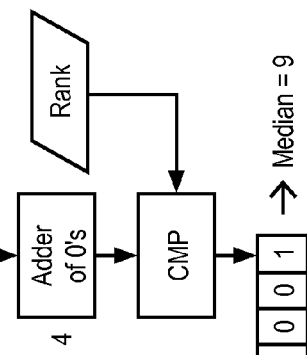

FIGS. 5A-5E illustrate the same example described above with respect to FIGS. 3A-3E only including the use of the flag bit to the keep track of the status of the rank filter processing. Referring to FIG. 5A, the flag bit of each input data sample is initially set to one. Referring to FIG. 5B, after the zeroes in the MSB have been added and compared to the rank, the result of the comparison causes the results bit to be set to one. With respect to the flag bit, if the MSB matched the result, the flag bit is maintained as a one; otherwise, the flag bit is set to zero. Referring to FIG. 5C, after adding the number of zeroes in the MSB−1 bit position to the rank, the result bit was set to zero. In this case, all the flag bits where the MSB−1 is equal to zero are maintained, while the others are reset to zero. As a result, only the last input bit sample has a flag bit that is equal to one. Referring to FIG. 5D, the process continues with the adding of the zeroes in the MSB−2 bit position and comparing that sum to the rank, thereby producing a zero result bit. As before, only the last input bit samples flag bit remains a one since its MSB−2 bit was a zero, which is equal to the result. Referring to FIG. 5E, the zeroes in the last bit location for all the input data samples are added and the result of the addition is compared to the rank. In this case, the result bit is set to one. Note that that bit sample represents the result, or output of the rank filter with the median of nine. However, this results was already known from after completing the comparisons at the third stage. Therefore, the fourth state was not necessary. In the present invention, after the third stage, using the flag bit, the result of the median would be known and output by the output logic and the fourth stage is not performed. Thus, by tracking which flag bits remain set to one, it is possible for the rank filter to determine the median prior to completing all stages of the pipeline. When only one flag bit remains set, the evaluation is completed and an output is generated.

Thus, a rank filter is disclosed having a W staged pipeline with W stages to receive N input data samples and operable to generate an output representing a median of the N input data samples as a result of the W stages completing execution, where W is a bit length of the inputs and W and N are integers greater than two. The rank filter includes output logic coupled to the W staged pipeline to determine the median prior to all W stages completing execution and to output the median. In one embodiment, the output logic determines the median by tracking flags associated with the input data samples, where one flag is associated and tracked for each input data sample. In one embodiment, the output logic is operable to determine the median when only one of the flags remains set.

In one embodiment, the output logic prevents one or more stages not yet completed from completing in response to determining the median. In one embodiment, the output logic prevents the one or more stages not yet completed from completing by disabling the one or more stages.

Figure 6:
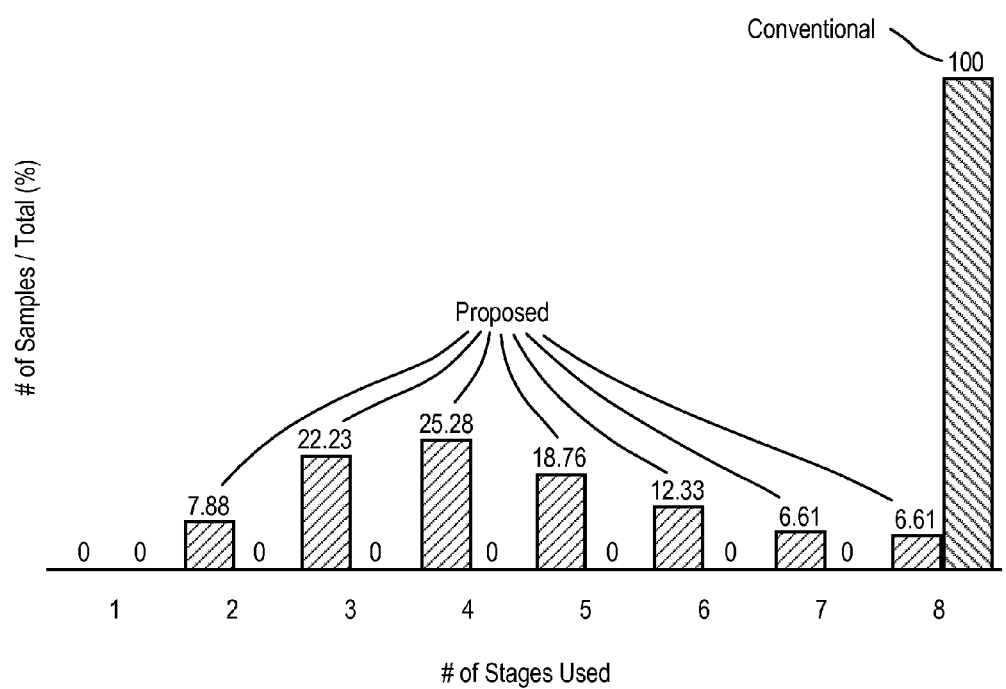
FIG. 6 shows a comparison on the number of stages in the pipeline used to calculate median.

By limiting the maximum number of stages in pipeline and the rank filter can be scaled to different computational cost requirements. FIG. 6 shows a comparison on the number of stages in the pipeline used to calculate median. Referring to FIG. 6, Conventional" refers to the state-of-art bit-level pipeline algorithm. The comparison was done by randomly generating 9 input data samples of 8 bit precision for 10000 times, and running the conventional and proposed algorithm. Since the conventional method does not offer the scalability, the maximum of 8 stages (equal to the number of input bit precision) are used. On the other hand, the rank filter described herein adaptively changes the necessary number of stages, without adding any error into the rank filter output.

Figure 7A:
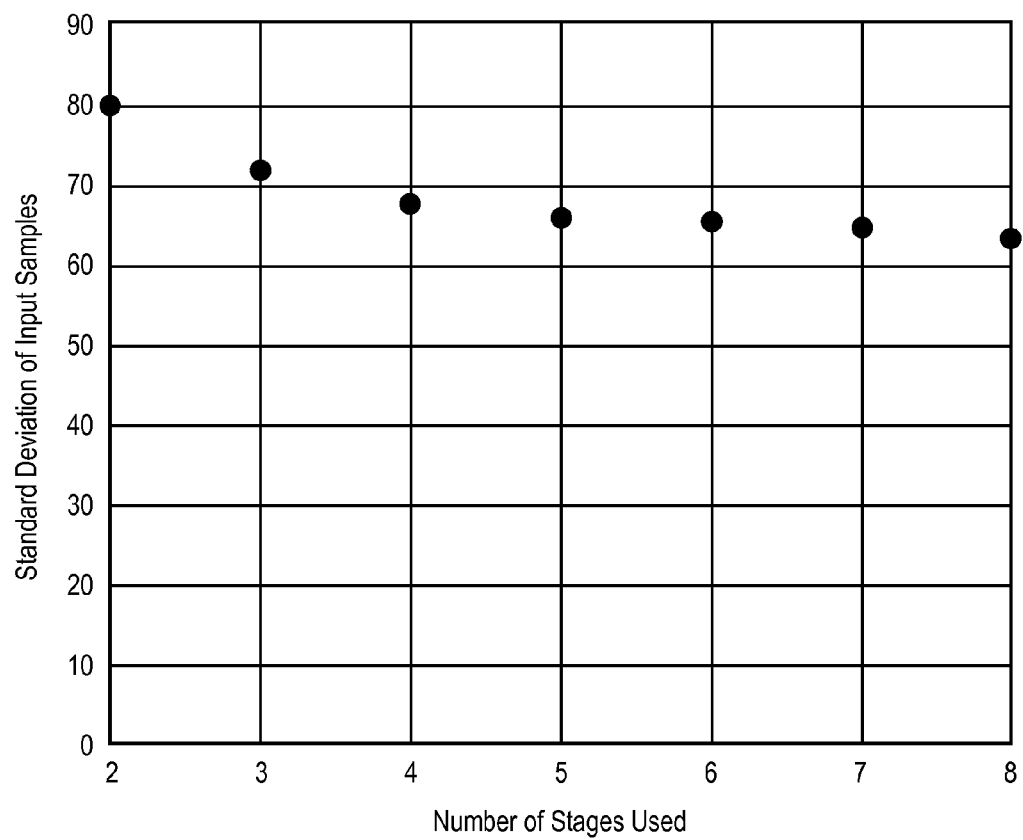
FIG. 7A show an average error comparison between one embodiment of the scalable rank filter disclosed herein and naïve truncation of a conventional state-of-art method.

One could argue that the rank filter disclosed herein merely truncate the conventional method's pipeline, simply using less number of stages for the bit-pipeline. However, this will simply cause the bit-precision loss in the rank filter output, resulting in high error with respect to the correct rank filter output. FIG. 7A show the average error comparison between the scalable rank filter disclosed herein and the naïve truncation of the conventional state-of-art method. In this case, the pipeline was truncated for both solution, and it is denoted in the horizontal axis as "MAX # of stages in the pipeline". For 8 stages, both solutions have 0 error, as they can use full input precision.

Figure 7B:
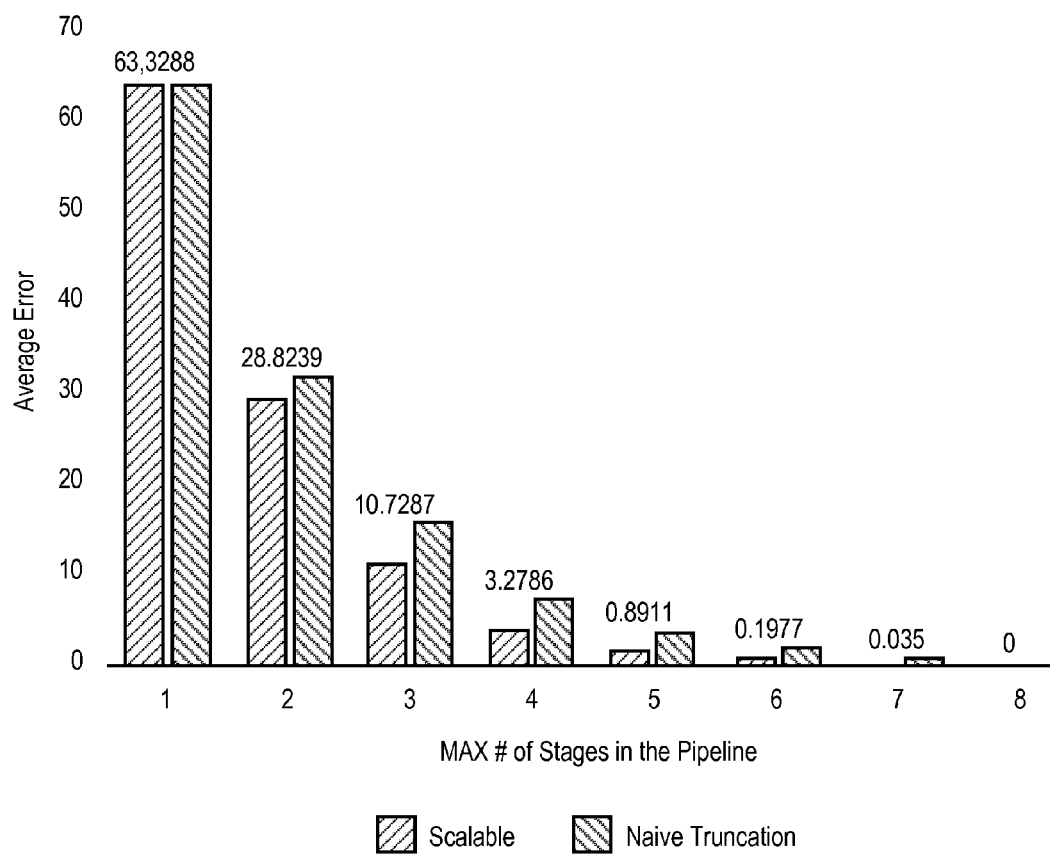
FIG. 7B illustrates the error improvement between the use of the scalable rank filter average error of the naïve truncation on the state-of-art method shown in FIG. 7A.

As the number of stages available in the pipeline is decreased, the accuracy of the scalable rank filter disclosed herein becomes prominent. FIG. 7B organizes the error improvement in %, |AveError proposed−Ave. Error truncl/ Ave. Error trunc*100, where Ave. Error trunc is the average error of the naïve truncation on the state-of-art method shown in FIG. 7A. In the scalable rank filter, average error is around 3.27 (less than 2 bit) at 4 stages pipeline, while the naïve truncation results in 7.41. Thus, the scalable rank filter results in higher accuracy with scaled architecture.

Figure 8:
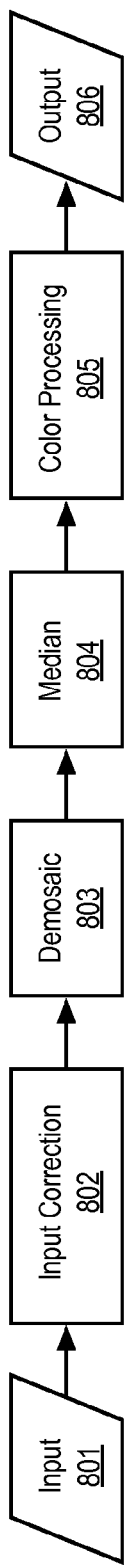
FIG. 8 illustrates a data flow of an image processing pipeline that uses the rank filter disclosed herein to produce a median.

The median filter has a number of applications. One such application is an image processing pipeline. Particularly, in one embodiment, the median filter is used for noise reduction. FIG. 8 illustrates a data flow of an image processing pipeline that uses the rank filter disclosed herein to produce a median. Referring to FIG. 8, an input 801 undergoes input correction 802 (e.g., lens shading correction, black level correction, etc.). After input correction 802, processing logic performs a demosaic operation 803 on the corrected input data. After the demosaic operation 803, a median filter 804 using the rank filter described herein to reduce noise. As an example usage, median (e.g., 3×3, 5×5, etc.) is applied to color difference channels (e.g., U and V) after demosaic operation 803 in the imaging signal pipeline (:=pipe).

In one embodiment, in median filter 804 in the pipe, the median of U is blended with the input U. The same is applied to the V channel. In one embodiment, the blending ratio is calculated in a number of ways well-known in the art. For example, the difference of median U and the input U is used to control the filtering. If the difference is larger than certain threshold, the image processing pipeline replaces the input with median. Other methods that may use this technique include local edge strength, local cornerness, etc.

After performing noise reduction using the median filter 804, the image data undergoes color processing 809 in a manner well-known in the art to generate output 806.

Figure 9:
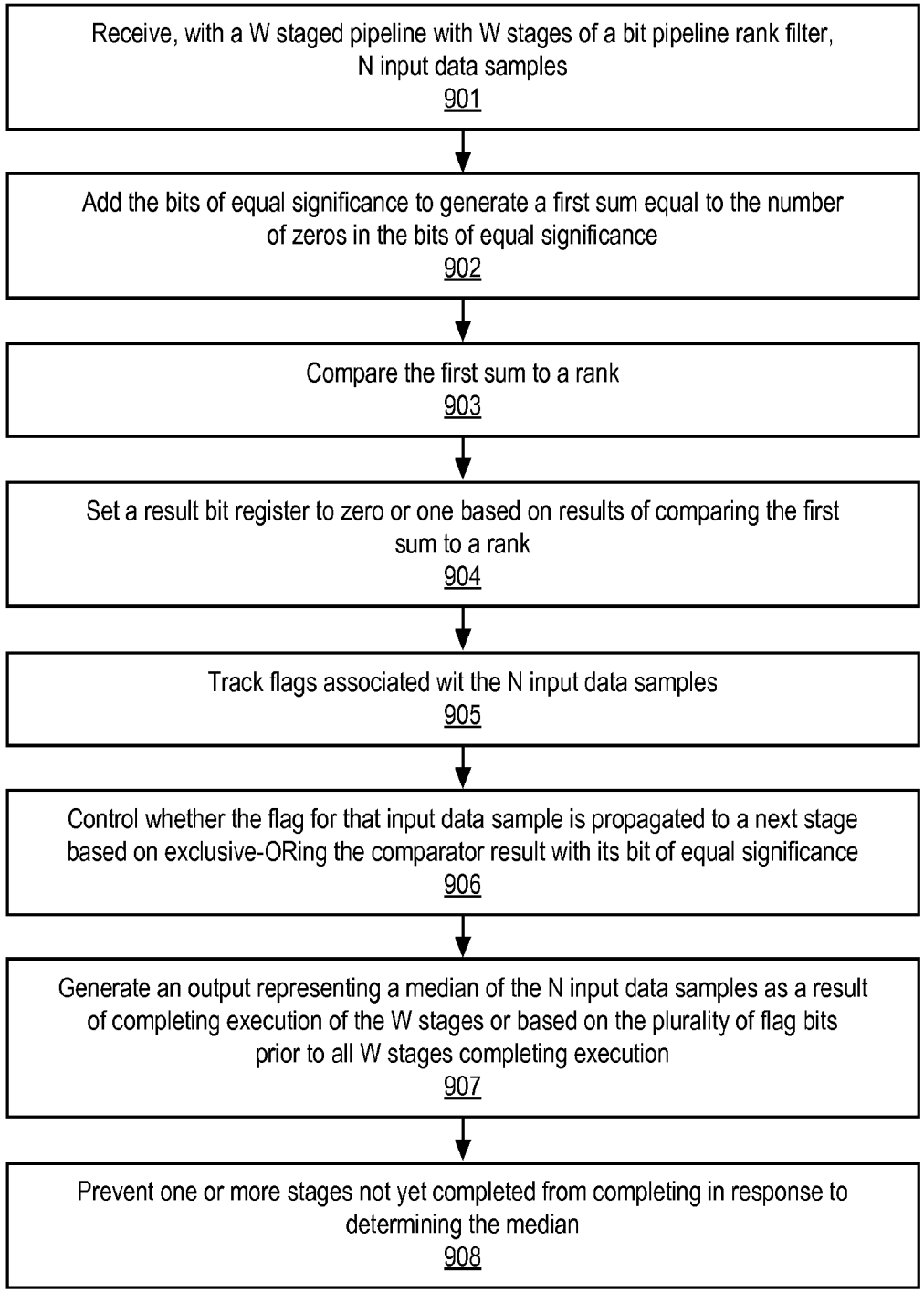
FIG. 9 is a flow diagram of one embodiment of a rank filtering process.

FIG. 9 is a flow diagram of one embodiment of a rank filtering process. The process is performed by processing logic that may comprise hardware (circuitry, dedicated logic, etc.), software (such as is run on a general purpose computer system or a dedicated machine), or a combination of both.

Referring to FIG. 9, the process begins by processing logic (e.g., sample register) receiving, by a W staged pipeline with W stages of a bit pipelined rank filter, N input data samples, where W is a bit length of the inputs and W and N are integers greater than two (processing block 901).

Processing logic adds together the bits of equal significance received from each of the N input data samples to generate a first sum equal to the number of zeros in the bits of equal significance (processing block 902), compares the first sum to a rank (processing block 903) and sets a result bit register to zero or one based on results of comparing the first sum to a rank (processing block 904).

Processing logic also tracks a plurality of flags associated with the N input data samples (processing block 905). One of the flags is associated with one of the N input data samples.

For each input data sample, processing logic controls whether the flag for that input data sample is propagated to a next stage in the pipeline based on exclusive-ORing the comparator result and its bit of equal significance (processing block 906). In one embodiment, the control includes generating a selection input for multiplexer having first and second data inputs using an output from exclusive-ORing the comparator result and the bit of equal significance to propagate the flag for said each input data sample.

Then processing logic generates an output representing a median of the N input data samples as a result of completing execution of the W stages or based on the plurality of flag bits prior to all W stages completing execution (processing block 907). In one embodiment, generating an output representing a median of the N input data samples is based on the plurality of flag bits prior to all W stages completing execution occurs when only one of the flags remains set.

After generating the results, processing logic prevents one or more stages not yet completed from completing in response to determining the median (processing block 908). In one embodiment, preventing the one or more stages not yet completed from completing comprises disabling the one or more stages.

Figure 10:
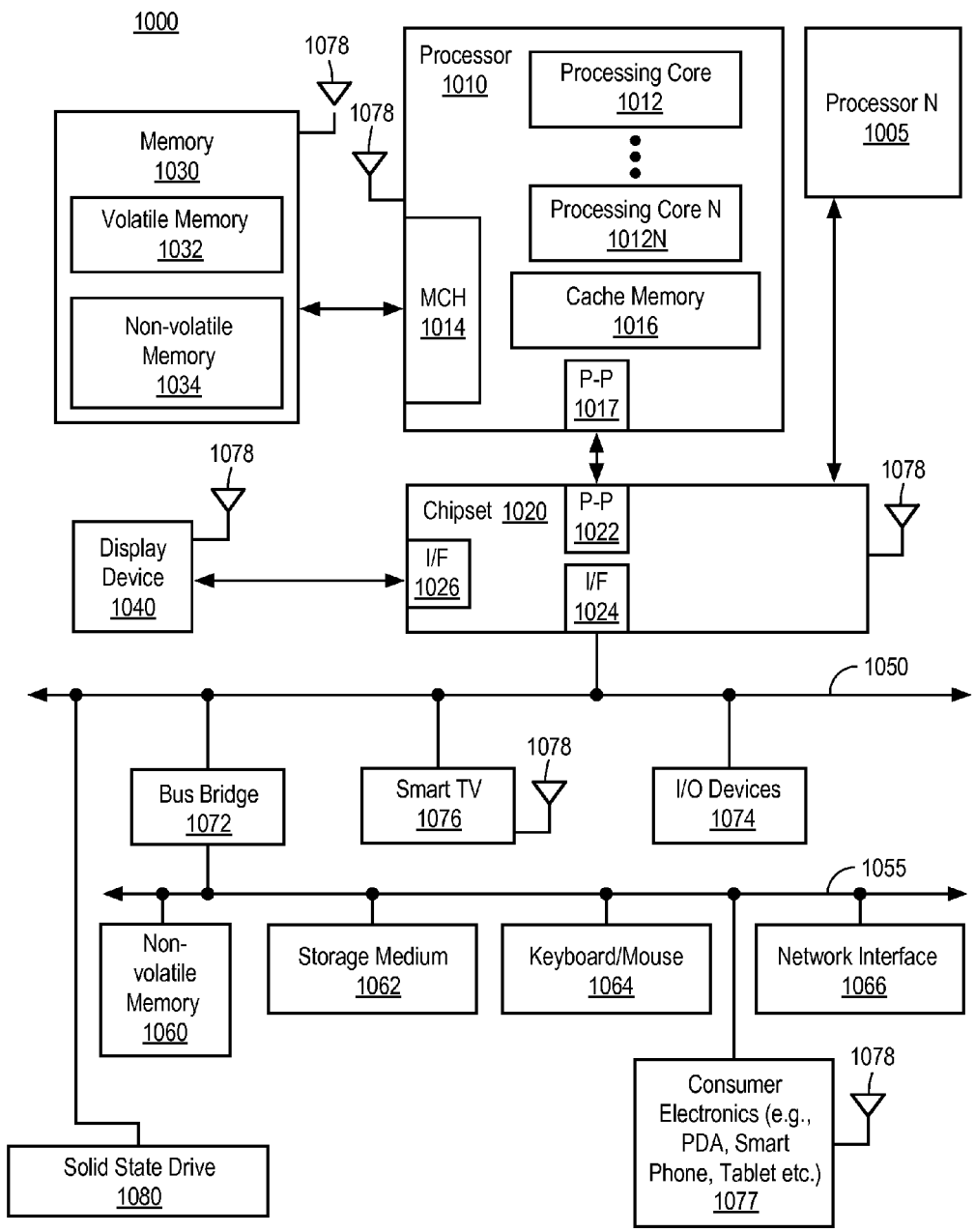
FIG. 10 is one embodiment of a system level diagram that may incorporate the techniques described above.

FIG. 10 is one embodiment of a system level diagram 1000 that may incorporate the techniques described above, such as the image processing pipeline of FIG. 8. For example, the techniques described above may be incorporated into a processor core of a processor in system 1000.

Referring to FIG. 10, system 1000 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, system 1000 implements the methods disclosed herein and may be a system on a chip (SOC) system.

In one embodiment, processor 1010 has one or more processor cores 1012 to 1012N, where 1012N represents the Nth processor core inside the processor 1010 where N is a positive integer. In one embodiment, system 1000 includes multiple processors including processors 1010 and 1005, where processor 1005 has logic similar or identical to logic of processor 1010. In one embodiment, system 1000 includes multiple processors including processors 1010 and 1005 such that processor 1005 has logic that is completely independent from the logic of processor 1010. In such an embodiment, a multi-package system 1000 is a heterogeneous multi-package system because the processors 1005 and 1010 have different logic units. In one embodiment, processing core 1012 includes, but is not limited to, pre-fetch logic to fetch instructions, decode logic to decode the instructions, execution logic to execute instructions and the like. In one embodiment, processor 1010 has a cache memory 1016 to cache instructions and/or data of the system 1000. In another embodiment of the invention, cache memory 1016 includes level one, level two and level three, cache memory, or any other configuration of the cache memory within processor 1010.

In one embodiment, processor 1010 includes a memory control hub (MCH) 1014, which is operable to perform functions that enable processor 1010 to access and communicate with a memory 1030 that includes a volatile memory 1032 and/or a non-volatile memory 1034. In one embodiment, memory control hub (MCH) 1014 is positioned outside of processor 1010 as an independent integrated circuit.

In one embodiment, processor 1010 is operable to communicate with memory 1030 and a chipset 1020. In such an embodiment, SSD 1080 executes the computer-executable instructions when SSD 1080 is powered up.

In one embodiment, processor 1010 is also coupled to a wireless antenna 1078 to communicate with any device configured to transmit and/or receive wireless signals. In one embodiment, wireless antenna interface 1078 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1034 includes, but is not limited to, flash memory (e.g., NAND, NOR), phase change memory (PCM), read-only memory (ROM), electrically erasable programmable read-only memory (EEPROM), or any other type of non-volatile memory device.

Memory 1030 stores information and instructions to be executed by processor 1010. In one embodiment, chipset 1020 connects with processor 1010 via Point-to-Point (PtP or P-P) interfaces 1017 and 1022. In one embodiment, chipset 1020 enables processor 1010 to connect to other modules in the system 1000. In one embodiment, interfaces 1017 and 1022 operate in accordance with a PtP communication protocol such as the Intel QuickPath Interconnect (QPI) or the like.

In one embodiment, chipset 1020 is operable to communicate with processor 1010, 1005, display device 1040, and other devices 1072, 1076, 1074, 1060, 1062, 1064, 1066, 1077, etc. In one embodiment, chipset 1020 is also coupled to a wireless antenna 1078 to communicate with any device configured to transmit and/or receive wireless signals.

In one embodiment, chipset 1020 connects to a display device 1040 via an interface 1026. In one embodiment, display device 1040 includes, but is not limited to, liquid crystal display (LCD), plasma, cathode ray tube (CRT) display, or any other form of visual display device. In addition, chipset 1020 connects to one or more buses 1050 and 1055 that interconnect various modules 1074, 1060, 1062, 1064, and 1066. In one embodiment, buses 1050 and 1055 may be interconnected together via a bus bridge 1072 if there is a mismatch in bus speed or communication protocol. In one embodiment, chipset 1020 couples with, but is not limited to, a non-volatile memory 1060, a mass storage device(s) 1062, a keyboard/mouse 1064, and a network interface 1066 via interface 1024, smart TV 1076, consumer electronics 1077, etc.

In one embodiment, mass storage device 1062 includes, but is not limited to, a solid state drive, a hard disk drive, a universal serial bus flash memory drive, or any other form of computer data storage medium. In one embodiment, network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface.

While the modules shown in FIG. 10 are depicted as separate blocks within the system 1000, the functions performed by some of these blocks may be integrated within a single semiconductor circuit or may be implemented using two or more separate integrated circuits.

In a first example embodiment, a rank filter comprises a W staged pipeline with W stages to receive N input data samples and operable to generate an output based on the N input data samples as a result of the W stages completing execution, where W is a bit length of the inputs and W and N are integers greater than two; and output logic coupled to the W staged pipeline to determine the output prior to all W stages completing execution and to output the median.

In another example embodiment, the subject matter of the first example embodiment can optionally include that the output is the median of the N input data samples.

In another example embodiment, the subject matter of the first example embodiment can optionally include that the output logic is operable to determine the median by tracking flags associated with the input data samples, wherein one flag is associated and tracked for each input data sample. In another example embodiment, the subject matter of this example embodiment can optionally include that the output logic is operable to determine a median when only one of the flags remains set.

In another example embodiment, the subject matter of the first example embodiment can optionally include that one flag is associated with each of the N input data samples, and further comprising a first N-bit adder to add the flag bits to generate a sum, the output logic determines the median prior to all W stages completing execution when sum equals one.

In another example embodiment, the subject matter of the first example embodiment can optionally include that each stage of the W stages is coupled to receive a bit of equal significance from each of the N input data samples, and each stage of the W stages comprises: a first N-bit adder to add together the bits of equal significance received from each of the N input data samples to generate a first sum equal to the number of zeros in the bits of equal significance; a comparator coupled to the first N-bit adder and coupled to receive a rank, the comparator to compare the first sum to a rank; a result register bit set to zero or one based on the comparator result. In another example embodiment, the subject matter of this example embodiment can optionally include, for each input data sample, an exclusive-OR (XOR) gate coupled to receive the comparator result and its bit of equal significance received by the first N-bit adder, to control whether the flag for said each input data sample is propagated to a next stage in the pipeline. In another example embodiment, the subject matter of this example embodiment can optionally include that, for each input data sample, a multiplexer having first and second data inputs and a selection input, the selection input and the first data input being coupled to the output of the XOR gate, the second data input being coupled to the flag for said each input data sample.

In another example embodiment, the subject matter of the first example embodiment can optionally include that the output logic prevents one or more stages not yet completed from completing in response to determining the output. In another example embodiment, the subject matter of this example embodiment can optionally include that the output logic prevents the one or more stages not yet completed from completing by disabling the one or more stages.

In another example embodiment, the subject matter of the first example embodiment can optionally include that the output logic is operable to select between two of the input data samples as an output of the rank filter prior to completing execution of all W stages.

In a second example embodiment, a processor comprises an interface to receive image data, an image processing pipeline coupled to the interface, the image processing pipeline having a rank filter for use in noise reduction, where the rank filter comprises a W staged pipeline with W stages to receive N input data samples and operable to generate an output representing a median of the N input data samples as a result of the W stages completing execution, where W is a bit length of the inputs and W and N are integers greater than two, and output logic coupled to the W staged pipeline to determine the median prior to all W stages completing execution and to output the median.

In another example embodiment, the subject matter of the second example embodiment can optionally include that the output logic is operable to determine the median by tracking flags associated with the input data samples, wherein one flag is associated and tracked for each input data sample.

In another example embodiment, the subject matter of the second example embodiment can optionally include that the output logic is operable to determine the median when only one of the flags remains set.

In another example embodiment, the subject matter of the second example embodiment can optionally include that one flag is associated with each of the N input data samples, and further comprises: a first N-bit adder to add the flag bits to generate a sum, the output logic determines the median prior to all W stages completing execution when sum equals one. In another example embodiment, the subject matter of this example embodiment can optionally include that each stage of the W stages is coupled to receive a bit of equal significance from each of the N input data samples, and each stage of the W stages comprises a first N-bit adder to add together the bits of equal significance received from each of the N input data samples to generate a first sum equal to the number of zeros in the bits of equal significance, a comparator coupled to the first N-bit adder and coupled to receive a rank, where the comparator to compare the first sum to a rank, and a result register bit set to zero or one based on the comparator result. In another example embodiment, the subject matter of this example embodiment can optionally include that the rank filter further comprises, for each input data sample, an exclusive-OR (XOR) gate coupled to receive the comparator result and its bit of equal significance received by the first N-bit adder, to control whether the flag for said each input data sample is propagated to a next stage in the pipeline. In another example embodiment, the subject matter of this example embodiment can optionally include that the rank filter further comprises, for each input data sample, a multiplexer having first and second data inputs and a selection input, the selection input and the first data input being coupled to the output of the XOR gate, the second data input being coupled to the flag for said each input data sample.

In a third example embodiment, a method comprises receiving, by a W staged pipeline with W stages of a bit pipelined rank filter, N input data samples, where W is a bit length of the inputs and W and N are integers greater than two, tracking a plurality of flags associated with the N input data samples, wherein one of the plurality of flags is associated with one of the N input data samples, and generating an output associated with the N input data samples as a result of completing execution of the W stages or based on the plurality of flags prior to all W stages completing execution.

In another example embodiment, the subject matter of the third example embodiment can optionally include that generating output comprises generating a median of the N input data samples based on the plurality of flag bits prior to all W stages completing execution occurs when only one of the flags remains set.

In another example embodiment, the subject matter of the third example embodiment can optionally include that each stage of the W stages is coupled to receive a bit of equal significance from each of the N input data samples, and the method further comprises adding together the bits of equal significance received from each of the N input data samples to generate a first sum equal to the number of zeros in the bits of equal significance, comparing the first sum to a rank, and setting a result bit register to zero or one based on results of comparing the first sum to a rank.

In another example embodiment, the subject matter of the third example embodiment can optionally include, for each input data sample, controlling whether the flag for said each input data sample is propagated to a next stage in the pipeline based on exclusive-ORing the comparator result and its bit of equal significance.

In another example embodiment, the subject matter of the third example embodiment can optionally include, for each input data sample, generating a selection input for multiplexer having first and second data inputs using an output from exclusive-ORing the comparator result and the bit of equal significance to propagate the flag for said each input data sample.

In another example embodiment, the subject matter of the third example embodiment can optionally include preventing one or more stages not yet completed from completing in response to determining the output.

In another example embodiment, the subject matter of the third example embodiment can optionally include that preventing the one or more stages not yet completed from completing comprises disabling the one or more stages.

Some portions of the detailed descriptions described above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the embodiments are not described with reference to any particular programming language. It will be appreciated that a variety of programming languages may be used to implement the teachings as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the embodiments disclosed herein will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential.

I claim:

1. A rank filter comprising:
a W staged pipeline with W stages to receive N input data samples and operable to generate an output based on the N input data samples as a result of the W stages completing execution, where W is a bit length of the inputs and W and N are integers greater than two; and
output logic coupled to the W staged pipeline to determine the output prior to all W stages completing execution and to output a median.

2. The rank filter defined in claim 1 wherein the output is the median of the N input data samples.

3. The rank filter defined in claim 1 wherein the output logic is operable to determine the median by tracking flags associated with the input data samples, wherein one flag is associated and tracked for each input data sample.

4. The rank filter defined in claim 3 wherein the output logic is operable to determine a median when only one of the flags remains set.

5. The rank filter defined in claim 3 wherein one flag is associated with each of the N input data samples, and further comprising:
a first N-bit adder to add the flag bits to generate a sum, the output logic determines the median prior to all W stages completing execution when sum equals one.

6. The rank filter defined in claim 5 wherein each stage of the W stages is coupled to receive a bit of equal significance from each of the N input data samples, and each stage of the W stages comprises:
a first N-bit adder to add together the bits of equal significance received from each of the N input data samples to generate a first sum equal to the number of zeros in the bits of equal significance;
a comparator coupled to the first N-bit adder and coupled to receive a rank, the comparator to compare the first sum to a rank;
a result register bit set to zero or one based on the comparator result.

7. The rank filter defined in claim 6 further comprising, for each input data sample,
an exclusive-OR (XOR) gate coupled to receive the comparator result and its bit of equal significance received by the first N-bit adder, to control whether the flag for said each input data sample is propagated to a next stage in the pipeline.

8. The rank filter defined in claim 7 further comprising, for each input data sample, a multiplexer having first and second data inputs and a selection input, the selection input and the first data input being coupled to the output of the XOR gate, the second data input being coupled to the flag for said each input data sample.

9. The rank filter defined in claim 1 wherein the output logic prevents one or more stages not yet completed from completing in response to determining the output is available.

10. The rank filter defined in claim 9 wherein the output logic prevents the one or more stages not yet completed from completing by disabling the one or more stages.

11. The rank filter defined in claim 1 wherein the output logic is operable to select between two of the input data samples as the output of the rank filter prior to completing execution of all W stages.

12. A processor comprising:
an interface to receive image data;
an image processing pipeline coupled to the interface, the image processing pipeline having a rank filter for use in noise reduction, the rank filter comprising
a W staged pipeline with W stages to receive N input data samples and operable to generate an output representing a median of the N input data samples as a result of the W stages completing execution, where W is a bit length of the inputs and W and N are integers greater than two; and
output logic coupled to the W staged pipeline to determine the median prior to all W stages completing execution and to output the median.

13. The processor defined in claim 12 wherein the output logic is operable to determine the median by tracking flags associated with the input data samples, wherein one flag is associated and tracked for each input data sample.

14. The processor defined in claim 13 wherein the output logic is operable to determine the median when only one of the flags remains set.

15. The processor defined in claim 12 wherein one flag is associated with each of the N input data samples, and further comprising:
a first N-bit adder to add the flag bits to generate a sum, the output logic determines the median prior to all W stages completing execution when sum equals one.

16. The processor defined in claim 15 wherein each stage of the W stages is coupled to receive a bit of equal significance from each of the N input data samples, and each stage of the W stages comprises:
a first N-bit adder to add together the bits of equal significance received from each of the N input data samples to generate a first sum equal to the number of zeros in the bits of equal significance;
a comparator coupled to the first N-bit adder and coupled to receive a rank, the comparator to compare the first sum to a rank;
a result register bit set to zero or one based on the comparator result.

17. The processor defined in claim 16 wherein the rank filter further comprises, for each input data sample,
an exclusive-OR (XOR) gate coupled to receive the comparator result and its bit of equal significance received by the first N-bit adder, to control whether the flag for said each input data sample is propagated to a next stage in the pipeline.

18. The processor defined in claim 17 wherein the rank filter further comprises, for each input data sample, a multiplexer having first and second data inputs and a selection input, the selection input and the first data input being coupled to the output of the XOR gate, the second data input being coupled to the flag for said each input data sample.

19. A method comprising:
receiving, by a W staged pipeline with W stages of a bit pipelined rank filter, N input data samples, where W is a bit length of the inputs and W and N are integers greater than two;
tracking a plurality of flags associated with the N input data samples, wherein one of the plurality of flags is associated with one of the N input data samples; and
generating an output associated with the N input data samples as a result of completing execution of the W stages or based on the plurality of flags prior to all W stages completing execution.

20. The method defined in claim 19 wherein generating the output comprising generating a median of the N input data samples based on the plurality of flag bits prior to all W stages completing execution occurs when only one of the flags remains set.

21. The method defined in claim 19 wherein each stage of the W stages is coupled to receive a bit of equal significance from each of the N input data samples, and further comprising:
   adding together the bits of equal significance received from each of the N input data samples to generate a first sum equal to the number of zeros in the bits of equal significance;
   comparing the first sum to a rank; and
   setting a result bit register to zero or one based on results of comparing the first sum to a rank.

22. The method defined in claim 21 further comprising, for each input data sample,
   controlling whether the flag for said each input data sample is propagated to a next stage in the pipeline based on exclusive-ORing the comparator result and its bit of equal significance.

23. The method defined in claim 22 further comprising, for each input data sample, generating a selection input for multiplexer having first and second data inputs using an output from exclusive-ORing the comparator result and the bit of equal significance to propagate the flag for said each input data sample.

24. The method defined in claim 19 further comprising preventing one or more stages not yet completed from completing in response to determining the output.

25. The method defined in claim 24 wherein preventing the one or more stages not yet completed from completing comprises disabling the one or more stages.

* * * * *